United States Patent
Maharyta

(10) Patent No.: US 10,439,640 B2
(45) Date of Patent: *Oct. 8, 2019

(54) RATIO-METRIC SELF-CAPACITANCE-TO-CODE CONVERTOR

(71) Applicant: Cypress Semiconductor Corporation, San Jose, CA (US)

(72) Inventor: Andriy Maharyta, Lviv (UA)

(73) Assignee: Cypress Semiconductor Corporation, San Jose, CA (US)

(*) Notice: Subject to any disclaimer, the term of this patent is extended or adjusted under 35 U.S.C. 154(b) by 66 days.

This patent is subject to a terminal disclaimer.

(21) Appl. No.: 15/730,456

(22) Filed: Oct. 11, 2017

(65) Prior Publication Data

US 2018/0083650 A1    Mar. 22, 2018

Related U.S. Application Data

(63) Continuation of application No. 15/199,559, filed on Jun. 30, 2016, now Pat. No. 9,819,360.

(60) Provisional application No. 62/329,937, filed on Apr. 29, 2016.

(51) Int. Cl.
*G01R 27/26* (2006.01)
*H03M 11/02* (2006.01)
*H03K 17/96* (2006.01)

(52) U.S. Cl.
CPC .......... *H03M 11/02* (2013.01); *H03K 17/962* (2013.01); *H03K 2217/960725* (2013.01)

(58) Field of Classification Search
USPC .................................. 324/658–690
See application file for complete search history.

(56) References Cited

U.S. PATENT DOCUMENTS

| 4,136,508 A | 1/1979 | Coleman et al. |
| 5,579,247 A | 11/1996 | Kerth et al. |
| 5,990,578 A * | 11/1999 | Krauss ..................... G01D 5/24 307/109 |
| 6,037,887 A * | 3/2000 | Wu ........................ H03M 3/486 341/139 |
| 6,452,531 B1 | 9/2002 | Miller et al. |

(Continued)

FOREIGN PATENT DOCUMENTS

WO    2012145034 A1    10/2012

OTHER PUBLICATIONS

Arup K. George, A 0.8-V Supply- and Temperature-Insensiive Capacitance-to-Digital Converter in 0.18-\mu CMOS, IEEE Sensors Journal, vol. 16, Issue 13, Apr. 27, 2016, pp. 5354-5364; 10 pages.

(Continued)

*Primary Examiner* — Vincent Q Nguyen
(74) *Attorney, Agent, or Firm* — Lowenstein Sandler LLP

(57) ABSTRACT

A circuit, system, and method for converting self capacitance to a digital value may include a pair of charge transfer circuits, each including a switch network, a sensor capacitor or modulation capacitor, and an integration capacitor may be coupled to a comparator to produce a data signal representative of the capacitance of the sensor capacitor of one of the charge transfer circuits. The data signal may be used to indicate a capacitance value of the self capacitance through conversion by a circuit.

20 Claims, 5 Drawing Sheets

(56) References Cited

U.S. PATENT DOCUMENTS

| | | | |
|---|---|---|---|
| 7,235,983 B2 | 6/2007 | McCartney et al. | |
| 7,495,589 B1 | 2/2009 | Trifonov et al. | |
| 7,902,842 B2 | 3/2011 | Reynolds et al. | |
| 8,169,238 B1 * | 5/2012 | Maharyta | G01D 5/24 324/658 |
| 8,564,313 B1 | 10/2013 | Ryshtun et al. | |
| 8,570,052 B1 | 10/2013 | Mahartya | |
| 8,952,838 B2 | 2/2015 | Waters et al. | |
| 9,100,043 B2 * | 8/2015 | Krauβ | H03M 1/442 |
| 9,166,621 B2 | 10/2015 | Kremin | |
| 2005/0099188 A1 | 5/2005 | Baxter | |
| 2008/0111714 A1 | 5/2008 | Kremin | |
| 2011/0163901 A1 | 7/2011 | Quiquempoix et al. | |
| 2012/0043971 A1 * | 2/2012 | Maharyta | G01R 27/2605 324/658 |
| 2012/0268145 A1 | 10/2012 | Chandra et al. | |
| 2014/0218223 A1 | 8/2014 | Darshan et al. | |

OTHER PUBLICATIONS

International Search Report for International Application No. PCT/US17/21872 dated May 24, 2017; 2 pages.

USPTO Advisory Action for U.S. Appl. No. 15/199,559 dated Jan. 31, 2017; 3 pages.

USPTO Final Rejection for U.S. Appl. No. 15/199,559 dated Nov. 22, 2016; 11 pages.

USPTO Non-Final Rejection for U.S. Appl. No. 15/199,559 dated Sep. 1, 2016; 13 pages.

USPTO Notice of Allowance for U.S. Appl. No. 15/199,559 dated Mar. 29, 2017; 11 pages.

Written Opinion of the International Searching Authority for International Application No. PCT/US17/21872 dated May 24, 2017; 5 pages.

SIPO Office Action for Application No. 201780036328.0 dated Mar. 29, 2019; 5 pages.

KIPO Office Action for Application No. 10-2018-7033899 dated Feb. 19, 2019; 3 pages.

* cited by examiner

RATIO-METRIC SELF-CAPACITANCE-TO-CODE CONVERTOR

RELATED APPLICATIONS

This Application is a Continuation Application of U.S. patent application Ser. No. 15/199,559, filed Jun. 30, 2016, which claims the benefit of U.S. Provisional Patent Application No. 62/329,937, filed Apr. 29, 2016, all of which are incorporated by reference herein in their entirety.

TECHNICAL FIELD

The present disclosure relates generally to sensing systems, and more particularly to capacitance-sensing systems configurable to measure self capacitance or convert self capacitance to digital values representative of the capacitance.

BACKGROUND

Capacitance sensing systems can sense electrical signals generated on electrodes that reflect changes in capacitance. Such changes in capacitance can indicate a touch event (i.e., the proximity of an object to particular electrodes). Capacitive sense elements may be used to replace mechanical buttons, knobs and other similar mechanical user interface controls. The use of a capacitive sense element allows for the elimination of complicated mechanical switches and buttons, providing reliable operation under harsh conditions. In addition, capacitive sense elements are widely used in modern customer applications, providing new user interface options in existing products. Capacitive sense elements can range from a single button to a large number arranged in the form of a capacitive sense array for a touch-sensing surface.

Arrays of capacitive sense elements work by measuring the capacitance of a capacitive sense element, and looking for a delta (change) in capacitance indicating a touch or presence of a conductive object. When a conductive object (e.g., a finger, hand, or other object) comes into contact with or close proximity to a capacitive sense element, the capacitance changes and the conductive object is detected. The capacitance changes of the capacitive touch sense elements can be measured by an electrical circuit. The electrical circuit converts the measured capacitances of the capacitive sense elements into digital values.

There are two typical types of capacitance: 1) mutual capacitance where the capacitance-sensing circuit has access to both electrodes of the capacitor; 2) self capacitance where the capacitance-sensing circuit has only access to one electrode of the capacitor where the second electrode is tied to a DC voltage level or is parasitically coupled to Earth Ground. A touch panel has a distributed load of capacitance of both types (1) and (2) and some touch solutions sense both capacitances either uniquely or in hybrid form with its various sense modes.

DETAILED DESCRIPTION

Figure 1:
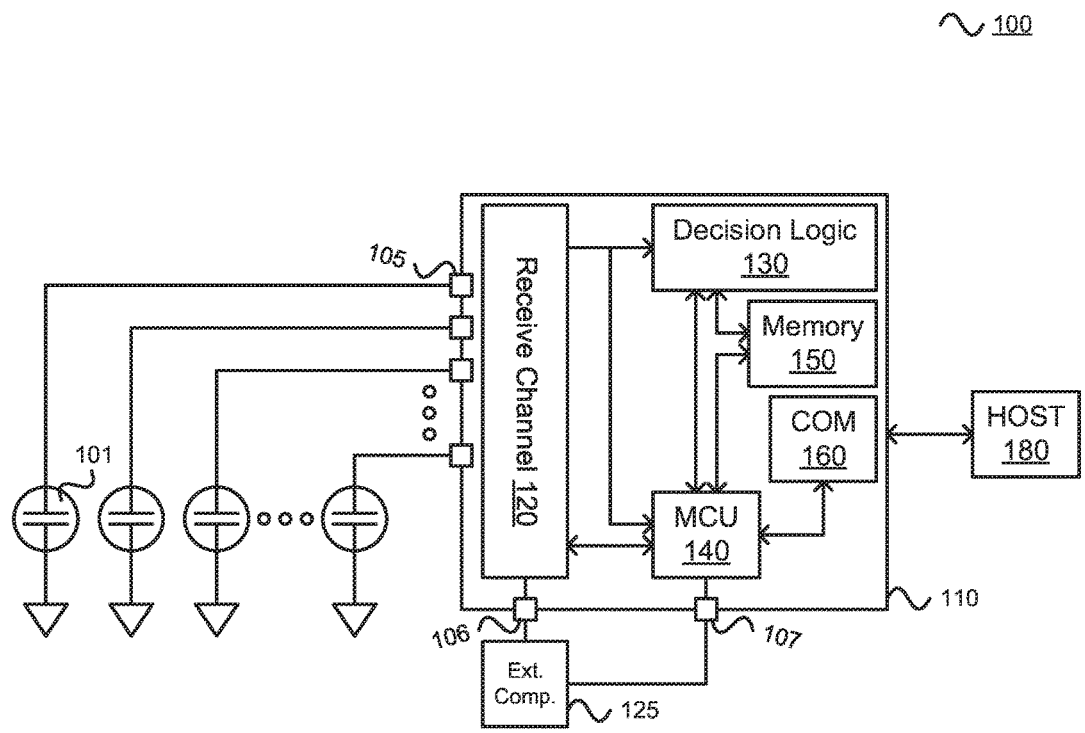
FIG. 1 illustrates a capacitance measurement system, according to one embodiment.

FIG. 1 illustrates a capacitance sensing system 100 that may incorporate the proposed ratiometric capacitance to code converter of the present application. System 100 may include at least one capacitance sensing electrode 101 coupled to a sensing circuit 110. In one embodiment, sensing circuit 110 may include circuitry integrated into a single device. In another embodiment, the various components of sensing circuit 110 may be distributed amongst several discrete components. For ease of explanation, sensing circuit 110 will be described herein as a single integrated circuit device. Sensing electrodes 101 may be coupled to sensing circuit 110 through inputs 105. Inputs 105 may be coupled to inputs of a receive channel 120. Receive channel 120 may be configured to convert capacitance to a digital value, such as with the proposed ratiometric capacitance to code converter. Receive channel 120 may be coupled to external components 125 as such may be necessary for the conversion. External components may be coupled to sensing circuit 110 through inputs 106. Receive channel 120 may be coupled to decision logic 130 and to MCU 140.

Decision logic 130 may be configured to process the output of receive channel 120 to determine whether a change in digital values representative of capacitance is associated with a touch or other action. Decision logic 130 may also be configured to track baseline or background capacitance values for use in touch detection. MCU 140 may be used to configure receive channel 120 based on system or application requirements. The configuration of receive channel 120 and MCU 140 may be at startup, during runtime, or based on some interrupt of host-generated commands. MCU 140 may also be configured to execute functions similar to decision logic 130 and used to make decisions regarding the presence of an object on the capacitance sensing electrodes 101 or for baseline or background capacitance tracking. MCU 140 and decision logic 130 may be coupled to memory unit 150 for storing values associated with touch detection. Memory unit 150 may also store program files and commands that are executed by MCU 140. MCU 140 may also be coupled to external components, as necessary, through inputs 107. MCU 140 may also be coupled to communication interface 160, which may be used to output status to host 180 or another external device. Communication interface 160 may also be configured to receive commands from an external device.

Figure 2:
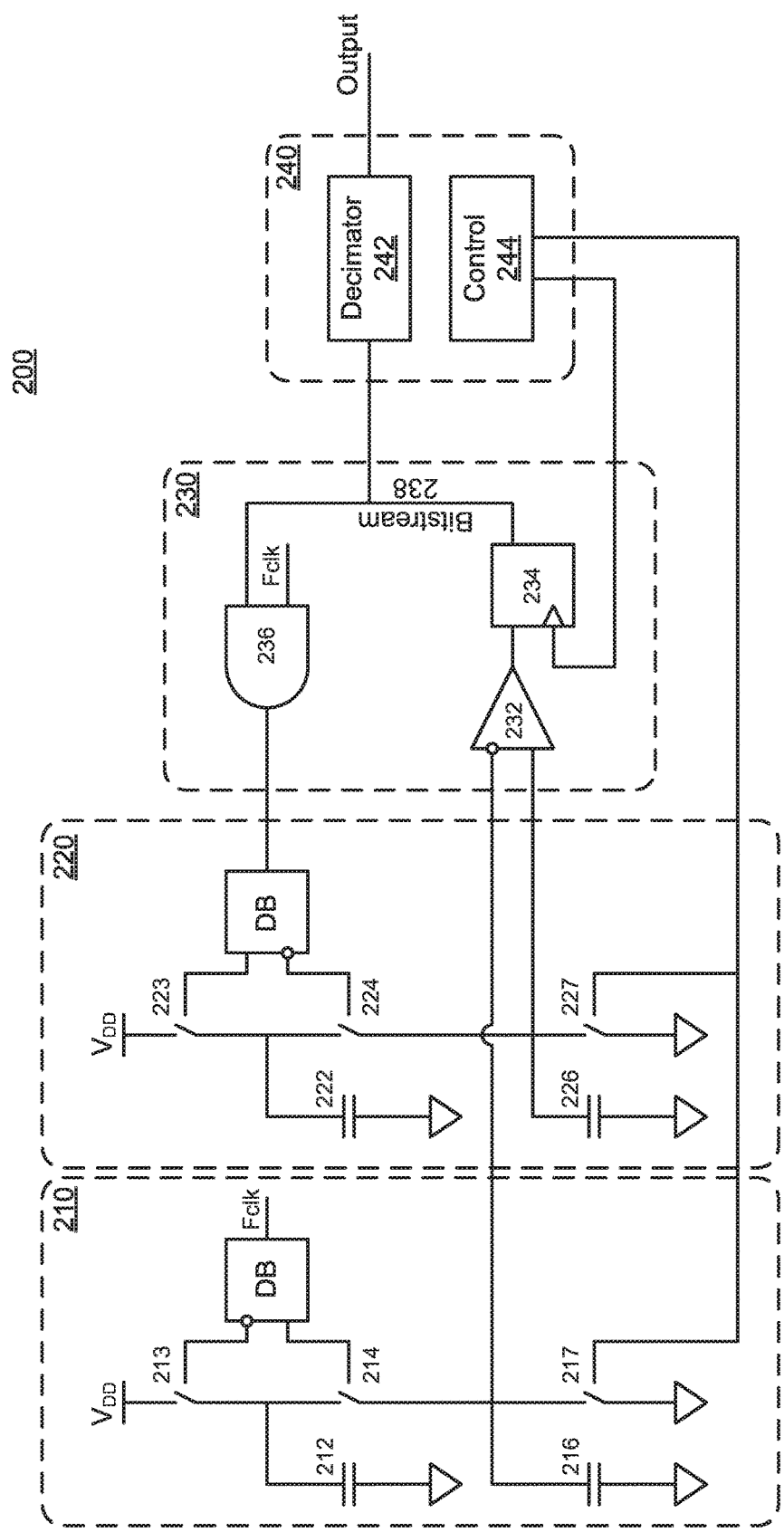
FIG. 2 illustrates a ratiometric capacitance to code converter, according to one embodiment.

FIG. 2 illustrates an embodiment of a capacitance-to-code converter 200 that may be implemented as receive channel 120 of sensing circuit 110 of FIG. 1. Capacitance-to-code converter 200 may include a first charge transfer circuit 210 including a sensor capacitor 212 (see capacitance sensing electrode 101 of FIG. 1). Sensor capacitor 212 may have a first plate alternately coupled to a source voltage and an integration capacitor 216. Sensor capacitor 212 may have a second plate coupled to a ground potential. Sensor capacitor 212 alternates between the source voltage and integration capacitor 216 through deadband switches 213 and 214. Deadband switches 213 and 214 may be clocked by clock signal Fclk. In a first phase, when switch 213 is closed, a voltage potential is produced on sensor capacitor 212. In a second phase, when switch 214 is closed, charge accumulated on sensor capacitor 212 during the first phase is transferred to integration capacitor 216.

Capacitor to code converter 200 includes a second charge transfer circuit 220 including a modulation capacitor 222. Modulation capacitor 222 may have a first plate alternately coupled to an integration capacitor 226 and a source voltage. Modulation capacitor 222 may have a second plate coupled to a ground potential. Modulation capacitor 222 alternates between the source voltage and integration capacitor 226 through deadband switches 223 and 224. Deadband switches 223 and 224 may be clocked by an output of sigma-delta modulator 230. Switches 223 and 224 may couple modulation capacitor 222 to integration capacitor 226 and the source voltage at opposite phases as modulation capacitor 222 is coupled to integration capacitor 226 and the source voltage. That is, in a first phase, when switch 224 is closed, modulation capacitor 222 is coupled to integration capacitor 226, transferring charge accumulated on the modulation capacitor 222 to integration capacitor 226. In the second phase, when switch 223 is closed, modulation capacitor 222 is coupled to the source voltage, allowing charge to accumulate on modulation capacitor 222.

Integration capacitors 216 and 226 may be coupled to inputs of comparator 232. In one embodiment, integration capacitor 216 is coupled to an inverting input of comparator 232. One of ordinary skill in the art would understand that integration capacitor 226 may be coupled to an inverting input instead. As the voltages on integration capacitors 216 and 226 are compared by comparator 232, a bit stream output 238 is generated. Bit stream output 238 may be a synchronized output of comparator 232 and a control clock from control block 244 through latch 234.

The bit stream output of comparator 232 may be digitized by decimator and control logic 240. The bit stream output 238 may also be used to provide a clock frequency to charge transfer circuit 220 through AND gate 236, which may have a second input coupled to Fclk.

The operation of capacitance-to-code converter 200 has a reset phase, wherein integration capacitors 216 and 226 are reset to a ground potential by switches 217 and 227, respectively. One of ordinary skill in the art would understand that a reset to ground is merely one embodiment. In various other embodiments, reset switches 217 and 227 may be configured to reset integration capacitors to voltages that are not a zero potential. After integration capacitors 216 and 226 are reset to ground, switches 217 and 227 are opened and the charge transfer from sensor capacitor 212 and modulation capacitor 222 begins. Integration capacitors 216 and 226 have charge accumulated on them by the repeated transfer of charge from sensor capacitor 212 and modulation capacitor 222, respectively. The duty cycle (DC) of the bit stream output of comparator 232, based on the inputs from the integration capacitor 216 and modulation integration capacitor 226 is given by:

$$DC = \frac{C_{int2}}{C_{int1}} \cdot \frac{C_s}{C_m}.$$

The duty cycle output depends on the capacitive relationship between the sensor capacitor 212 and the reference capacitors (modulation capacitor 222 and integration capacitors 216 and 226, wherein Cint1 is integration capacitor 216 and Cint2 is integration capacitor 226). In one embodiment, reference capacitors may be sensors but configured as reference capacitors for measurement of other sensor capacitors. As long as the capacitance values of the reference capacitors (either discrete or on-chip capacitors, or sensor capacitors) remain relatively constant over the measurement of the sensor capacitor under test, capacitance-to-code converter 200 operates as expected. If a sensor capacitor not under test is used as the modulation capacitor 222, the temperature coefficients of the sensor capacitor 212 under test and the modulation capacitor 222 will be similar, providing temperature insensitivity. This temperature insensitivity may be particularly useful in wake-on-touch and low-power applications.

In one embodiment, the capacitance value of each integration capacitor 216 and 226 is considerable larger than its respective sensor capacitor 212 or modulation capacitor 222. The values of integration capacitors 216 and 226 may be 1000 times greater than the capacitance of the sensor capacitor 212 and modulation capacitor 222.

As the number of charge transfer cycles for integration capacitors 216 and 226 define the resolution of the capacitance to code converter 200, a digital timer counts the number of charge transfer cycles (the operation of switches 213/214 and 223/224) and terminates the measurement cycle when the required number of charge transfer cycles has been reached. Of note, the output of the capacitance-to-code converter 200 is not dependent on the clock frequency, Fclk, only the number of clock pulses for the desired measurement count. Also, the output of capacitance-to-code converter 200 is not dependent on supply voltage ($V_{DD}$). This architecture allows the use of spread-spectrum, random, pseudo-random, or fixed frequency clock sequencers. Fclk may be any of these clock types.

As the output of comparator 232 is processed by the decimator and control logic 240, the digital value, RawData, representative of the capacitance on sensor capacitor 212 may be given by:

$$RawData = DC \cdot N_{RES},$$

where $N_{RES}$ is the number of Fclk cycles during the measurement time. In one embodiment, $N_{RES}$ is selected from the order of two:

$$N_{RES} = 2^n - 1,$$

where n is a whole, positive integer. The average excitation current, $I_{s1\_avg}$, which defines the noise immunity to external noise is given by:

$$I_{s1\_avg} = V_{swing\_avg} \cdot F_{clk} \cdot C_{s1},$$

where $V_{swing\_avg}$ is the average difference between the voltage on integration capacitor 216 and the supply voltage of charge transfer circuit 210 over the measurement interval.

Decimator and logic block 240 may include a decimator 242 and a module 244. Decimator 242 may be a digital filter configured to reduce the input sample rate received from the output of latch 234 and provide a reduced data rate as the output of decimator and logic block 240.

Figure 3:
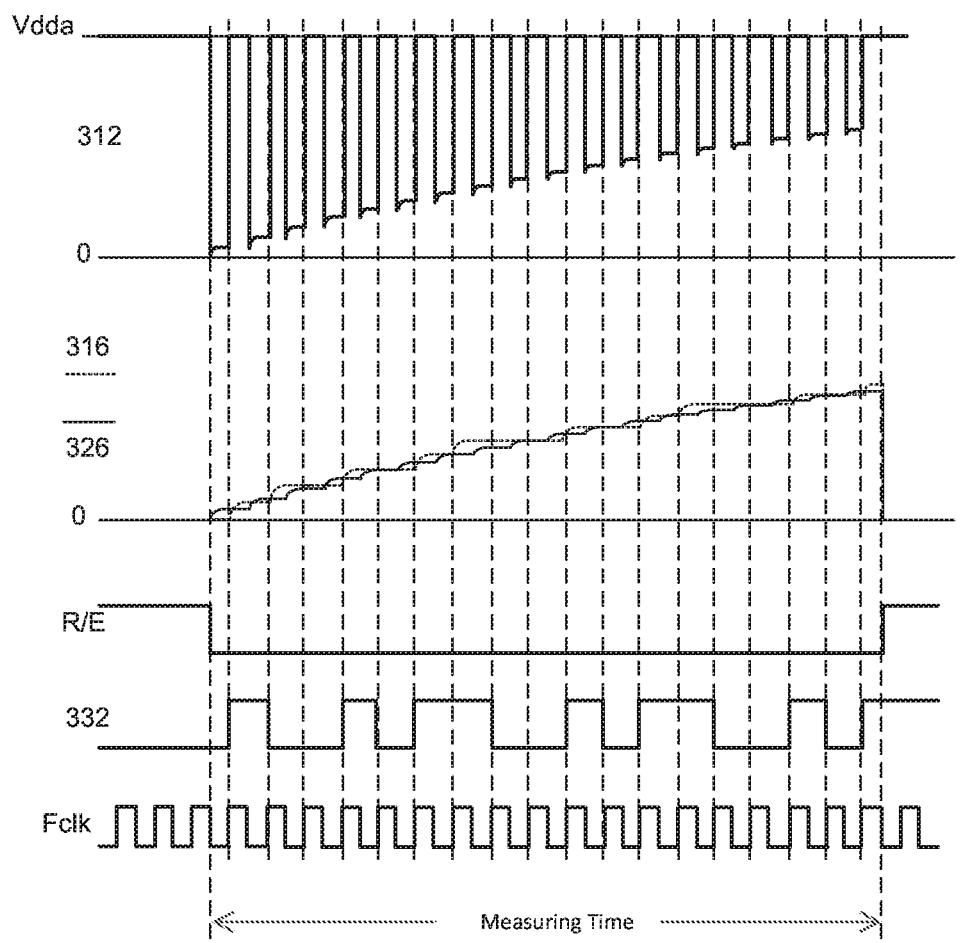
FIG. 3 illustrates voltage waveforms for a ratiometric capacitance to code converter, according to one embodiment.

FIG. 3 illustrates voltage waveforms at various nodes of the capacitance to code converter 200. During operation of charge transfer circuit 210, the voltage on sensor capacitor 212 increases according to waveform 312. Note, this is an exponential increase, but one of ordinary skill in the art would understand that charge transfer circuit 210 may be configured to generate a linear response as charge is shared with integration capacitor 216. As charge is accumulated on integration capacitor 216 and modulation capacitor 226, the voltage on each increases as shown by wave forms 316 and 326. Fclk provides the clock signal to the charge transfer operation as well as the comparator 232, which generates the bitstream output waveform 332, which is converted to the digital value used in making determinations on the state of sensor capacitor 212.

As stated above with regard to FIG. 2, the proportionate capacitance of sensor capacitor 212 and modulation capacitor 222 to integration capacitors 216 and 226, respectively, determines the effective resolution and the external noise immunity of capacitance to code converter 200. Proportionately larger integration capacitors may provide greater resolution and noise immunity. With regard to noise immunity, the greater the average value of $V_{swing}$, the greater the immunity. $V_{swing}$ is the difference between the voltage on the integration capacitor at each charge transfer cycle and the supply voltage.

Figure 4:
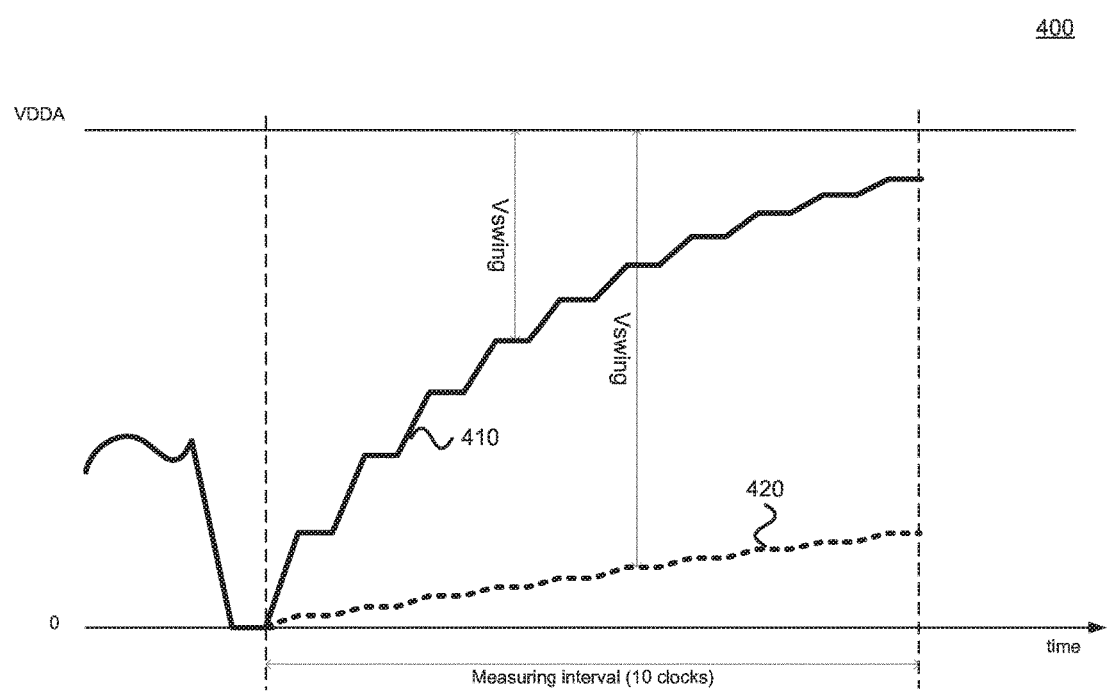
FIG. 4 illustrates accumulated voltage waveforms for varied proportions of sensor, modulation, and integration capacitances, according to one embodiment.

FIG. 4 illustrates example $V_{swing}$ values for sensor-to-integration capacitance ratios of 1:10 (410) and 1:100 (420). With a smaller integration capacitor, relative to the sensor capacitor, the voltage increase across the integration capacitor with each charge transfer cycle is greater. For example, if ten charge transfer cycles are used for the conversion measurement window, the average $V_{swing}$ value at each cycle is greater.

Figure 5:
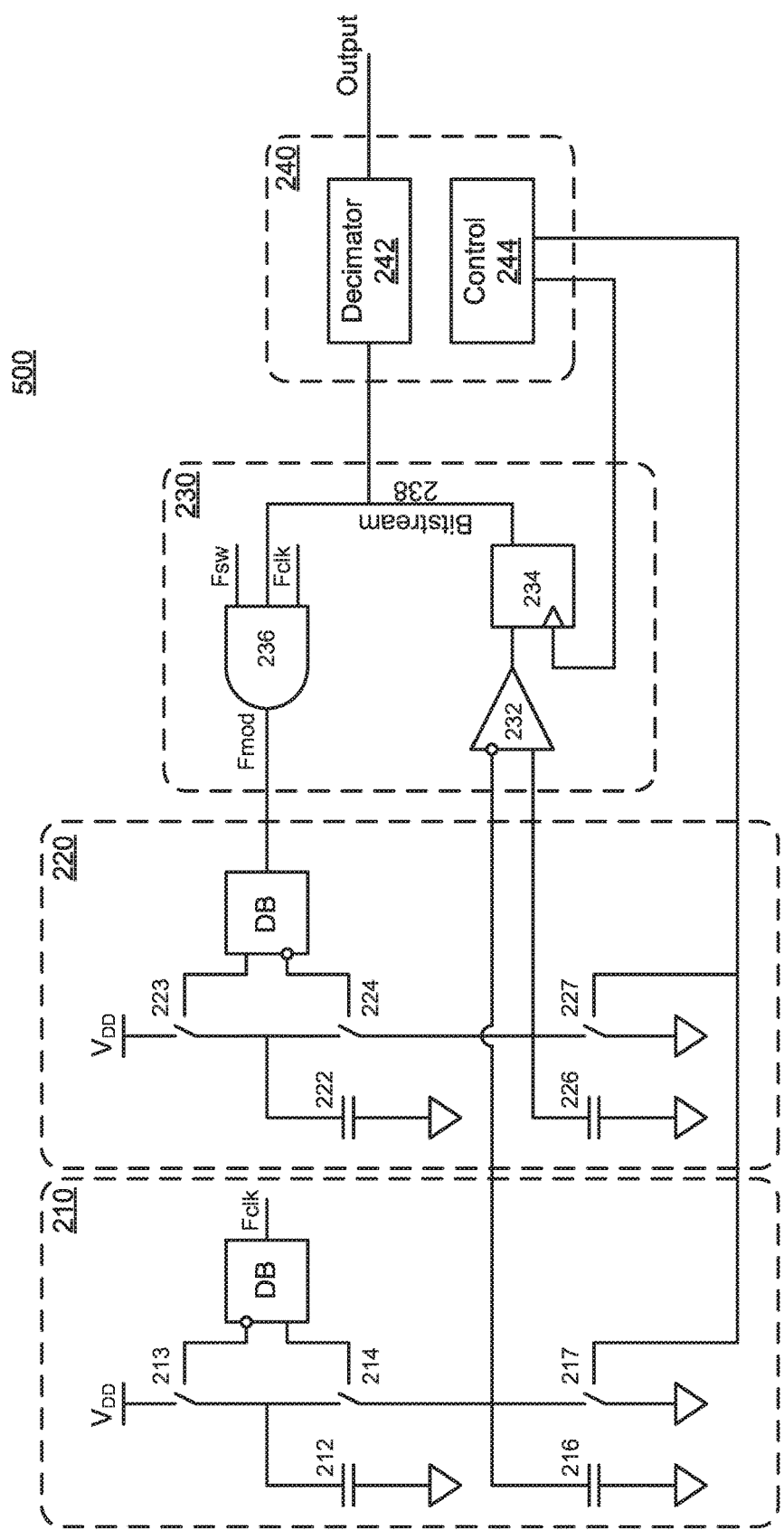
FIG. 5 illustrates a ratiometric capacitance to code converter with different clock sources, according to one embodiment

FIG. 5 illustrates another embodiment of capacitance to code converter 500, which is similar to capacitance to code converter 200 of FIG. 2, but wherein the clock frequency, F mod, of the modulation capacitor charge transfer circuit 220 is greater than the clock frequency, Fsw, of the sensor capacitor charge transfer circuit 210. In this embodiment, F mod may be given by:

$$F\ mod = N \cdot F_{SW},$$

where N is a positive integer. The duty cycle output of capacitance to code converter 500 is therefore given by:

$$DC = \frac{C_{int2}}{C_{int1}} \cdot \frac{C_s}{N \cdot C_m}.$$

Increasing the F mod relative to Fsw allows for smaller modulation capacitors (212 and 222), which may allow them to be integrated on-chip far easier.

The embodiments described herein may be used in various designs of mutual-capacitance sensing arrays of the capacitance sensing system, or in self-capacitance sensing arrays. In one embodiment, the capacitance sensing system detects multiple sense elements that are activated in the array, and can analyze a signal pattern on the neighboring sense elements to separate noise from actual signal. The embodiments described herein are not tied to a particular capacitive sensing solution and can be used as well with other sensing solutions, including optical sensing solutions, as would be appreciated by one of ordinary skill in the art having the benefit of this disclosure.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments described herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A capacitance-to-code converter comprising:
   a first charge transfer circuit comprising a sensor capacitor alternately coupled to a first voltage potential node and a first integration capacitor through a first switch network;
   a second charge transfer circuit comprising a modulation capacitor alternately coupled to a second voltage potential node and a second integration capacitor through a second switch network;
   a comparator circuit coupled to the first charge transfer circuit at the first integration capacitor and the second charge transfer circuit at the second integration capacitor, the comparator circuit configured to output a data signal; and
   a converter circuit coupled to the comparator circuit and configured to convert the data signal to a digital value representative of a capacitance of the sensor capacitor.

2. The capacitance-to-code converter of claim 1, wherein a clock source of the second charge transfer circuit is derived from the data signal and a system clock.

3. The capacitance-to-code converter of claim 1, wherein the converter circuit is a digitizer, wherein the comparator circuit is configured to output the data signal as a bitstream and the digitizer is configured to convert the bitstream to the digital value.

4. The capacitance-to-code converter of claim 3, wherein the digitizer comprises a digital filter configured to reduce a sample rate on an input of the digitizer.

5. The capacitance-to-code converter of claim 3, wherein the digitizer comprises a decimator coupled to an output of comparator, the decimator configured to count a number of clock cycles from a system clock.

6. The capacitance-to-code converter of claim 1, wherein the first charge transfer circuit comprises a first reset switch configured to discharge the first integration capacitor, and wherein the second charge transfer circuit comprises a second reset switch configured to discharge the second integration capacitor.

7. The capacitance-to-code converter of claim 1, wherein the first charge transfer circuit is clocked by a system clock.

8. The capacitance-to-code converter of claim 1, wherein the modulation capacitor, in a first mode, comprises a sensor capacitor measurable by the capacitance-to-code converter and, in a second mode, comprises the sensor capacitor configured as the modulation capacitor.

9. The capacitance-to-code converter of claim 1, wherein at least one of the first integration capacitor and the second integration capacitor is disposed on an integrated circuit comprising the capacitance-to-code converter.

10. The capacitance-to-code converter of claim 1, wherein at least one of the first integration capacitor and the second integration capacitor is disposed external to an integrated circuit comprising the capacitance-to-code converter.

11. A system comprising:
    at least one electrode comprising a capacitance that is alterable by a proximity of a conductive object to the at least one electrode; and
    a capacitance measurement circuit comprising:
        a first charge transfer circuit coupled to the at least one electrode and a first integration capacitor, the first charge transfer circuit comprising a first switch network for alternately coupling the at least one electrode to a first voltage potential node and the first integration capacitor;
        a second charge transfer circuit comprising a modulation capacitor and a second integration capacitor, the second charge transfer circuit comprising a second switch network for alternately coupling the modulation capacitor to a second voltage potential node and the second integration capacitor;
        a comparator comprising a first input coupled to the first charge transfer circuit at the first integration capacitor and a second input coupled to the second charge transfer circuit at the second integration capacitor, the comparator configured to output a data signal; and
        a converter circuit coupled to the comparator and configured to convert the data signal to a digital value representative of a capacitance of the at least one electrode.

12. The system of claim 11, wherein the converter circuit is a digitizer, wherein the comparator is configured to output the data signal as a bitstream and the digitizer is configured to convert the bitstream to the digital value.

13. The system of claim 11, wherein the at least one electrode comprises:
    a first electrode configured to comprise a capacitance that varies in response to a proximity of a conductive object to the first electrode; and a second electrode comprising a capacitance that does not vary in response to the proximity of the conductive object to the first electrode, wherein a clock source of the second charge transfer circuit is derived from the data signal and a system clock.

14. The system of claim 11, wherein the first charge transfer circuit comprises a first reset switch configured to discharge the first integration capacitor, and wherein the second charge transfer circuit comprises a second reset switch configured to discharge the second integration capacitor.

15. The system of claim 11, wherein at least one of the first integration capacitor and second integration capacitor is disposed external to an integrated circuit comprising the capacitance measurement circuit.

16. The system of claim 11, wherein a clock source of the second charge transfer circuit is derived from the data signal and a system clock.

17. An apparatus comprising:
a first switch network;
a second switch network;
a first voltage potential node;
a first integration capacitor to accumulate a first charge through a plurality of first charge transfer operations by alternately coupling the first voltage potential node and the first integration capacitor to a sensor capacitor through the first switch network;
a second voltage potential node;
a second integration capacitor to accumulate a second charge through a plurality of second charge transfer operations by alternately coupling the second voltage potential node and the second integration capacitor to a modulation capacitor through the second switch network;
a comparator to generate a data signal from a comparison of the first charge and the second charge; and
a converter circuit coupled to the comparator, the converter circuit to convert the data signal to a digital value representative of a capacitance of the sensor capacitor.

18. The apparatus of claim 17, wherein the plurality of first charge transfer operations comprises:
accumulating the first charge on the sensor capacitor in a first phase; and
transferring the first charge from the sensor capacitor to the first integration capacitor in a second phase.

19. The apparatus of claim 17, wherein the plurality of second charge transfer operations comprises:
accumulating the second charge on the modulation capacitor in a first phase; and
transferring the second charge from the modulation capacitor to the second integration capacitor in a second phase.

20. The apparatus of claim 17, wherein the plurality of first charge transfer operations include a reset operation.

* * * * *